United States Patent
Lehnert et al.

(10) Patent No.: US 8,351,621 B2
(45) Date of Patent: Jan. 8, 2013

(54) SYSTEM AND METHOD FOR EXCURSION LIMITING

(75) Inventors: Hilmar Lehnert, Framingham, MA (US); Michael W. Stark, Acton, MA (US); Joseph B. Gaalaas, Boston, MA (US); Brian J. Gawronski, Framingham, MA (US)

(73) Assignee: Bose Corporation, Framingham, MA (US)

( * ) Notice: Subject to any disclaimer, the term of this patent is extended or adjusted under 35 U.S.C. 154(b) by 286 days.

(21) Appl. No.: 12/732,696

(22) Filed: Mar. 26, 2010

(65) Prior Publication Data
US 2011/0235824 A1 Sep. 29, 2011

(51) Int. Cl.
*H03G 7/00* (2006.01)
(52) U.S. Cl. .......... 381/106; 381/94.8; 333/14; 327/309
(58) Field of Classification Search ........ 381/94.1–94.3, 381/94.8, 98–100, 106, 94.5, 94.7; 333/14; 327/309
See application file for complete search history.

(56) References Cited

U.S. PATENT DOCUMENTS

| | | | | |
|---|---|---|---|---|
| 4,412,100 A | | 10/1983 | Orban | |
| 4,736,433 A | * | 4/1988 | Dolby | 381/106 |
| 5,737,432 A | * | 4/1998 | Werrbach | 381/94.1 |
| 5,737,434 A | * | 4/1998 | Orban | 381/106 |
| 6,175,631 B1 | * | 1/2001 | Davis et al. | 381/17 |
| 6,337,999 B1 | * | 1/2002 | Orban | 700/94 |
| 6,924,761 B2 | * | 8/2005 | Jiang et al. | 341/154 |
| 6,928,170 B1 | * | 8/2005 | Statham | 381/92 |
| 7,206,419 B1 | * | 4/2007 | Poletti | 381/98 |
| 7,624,022 B2 | * | 11/2009 | Son et al. | 704/503 |
| 2008/0175397 A1 | * | 7/2008 | Holman | 381/55 |

FOREIGN PATENT DOCUMENTS
WO 2009030235 A1 3/2009

OTHER PUBLICATIONS

International Search Report and Written Opinion dated Jun. 1, 2011 for PCT/US2011/027862.

* cited by examiner

*Primary Examiner* — Xu Mei

(57) ABSTRACT

A system for limiting the excursion of an audio speaker. The system may include first lowpass filter circuitry configured to receive a system input signal and to generate a first signal. The system may further include clipping circuitry configured between the first lowpass filter circuitry and the first combiner circuitry. The system may include first highpass filter circuitry configured to receive the system input signal and to generate a second signal. The system may include second lowpass filter circuitry configured to receive a combined output signal from the first combiner circuitry. The system may include allpass filter circuitry configured to receive the system input signal and to generate a fourth signal. The system may include second highpass filter circuitry configured to receive the fourth signal from the allpass filter circuitry. The second combiner circuitry may be configured to generate an excursion limiting output signal.

20 Claims, 17 Drawing Sheets

500

1300

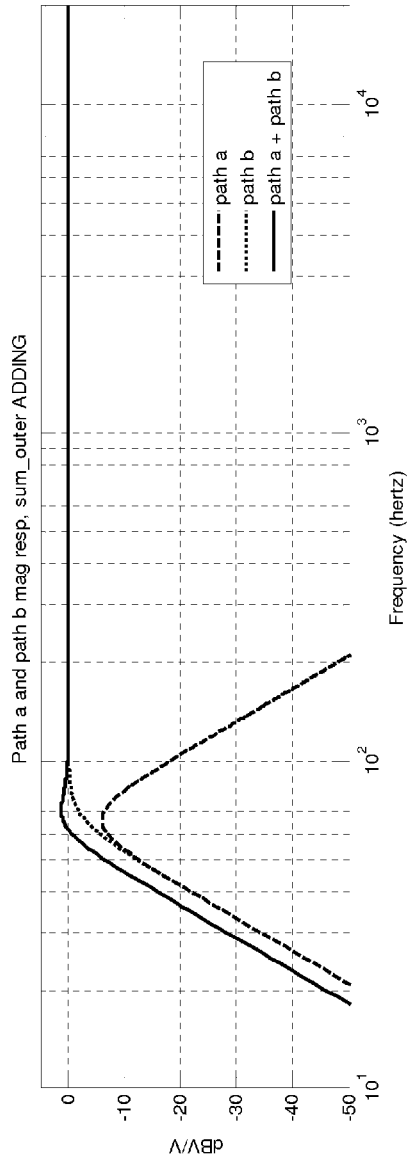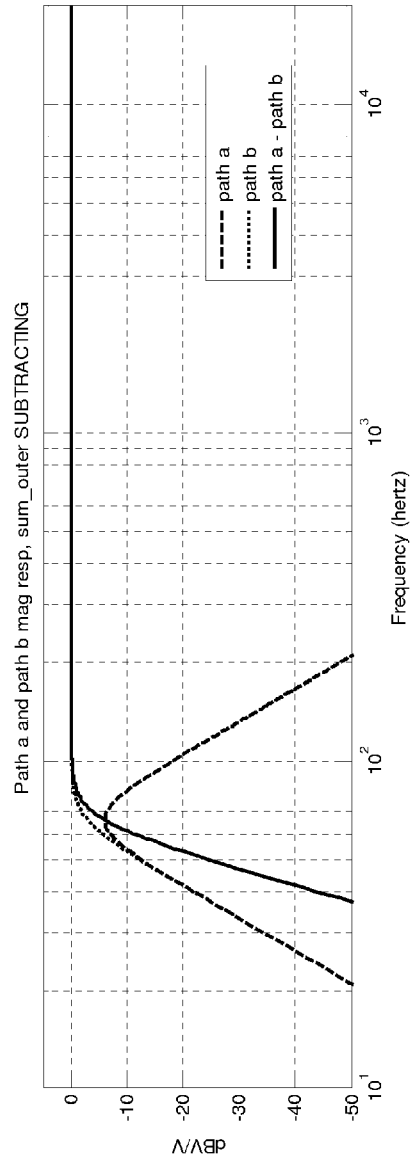

SYSTEM AND METHOD FOR EXCURSION LIMITING

TECHNICAL FIELD

This disclosure generally relates to signal processing. More particularly, the present disclosure relates to a system and method for excursion limiting.

BACKGROUND

Most audio loudspeakers produce sound through the physical movement, or excursion, of a cone. Excursion limiters have been used in various products, such as audio speakers, to minimize output voltage to the speaker at high output levels. The advantage of excursion limiters over other limiting methods is that they may be tuned to have virtually no effect at low or moderate listening levels, but take effect at higher listening levels. This may help to preserve spectral quality without burdening the system's performance at low levels, and may improve sound quality at higher levels by minimizing distortion and unwanted excursion-related artifacts. It also may help extend the life of the driver by minimizing excursion-related damage.

Many components of an audio reproduction chain, notably loudspeakers and multiway loudspeaker crossover networks, introduce group delay in the audio signal. Group delay generally refers to a measure of the transmit time of a signal through a device under test (DUT), versus frequency. A number of experiments have shown that excessive group delay in a signal processing block can cause unwanted audible artifacts, especially at low frequencies. These may manifest audibly as a smearing of time response, such that the fundamentals of a bass note may sound like it has been delayed from the rest of the sound of the instrument. Exactly how much group delay is tolerable seems to depend on frequency; regardless, excessive group delay should be minimized as much as possible.

Excursion limiters may be used on the low-frequency speakers, such as a woofer, as they may allow the low frequency bandwidth to be extended. With a more standard configuration, a high-order, high pass filter may be used to protect the woofer from excessive excursion below resonance. This may be critical in a tuned enclosure such as a bass reflex or waveguide enclosure because the excursion of the driver may tend to increase very rapidly below the resonance of the system. Using an excursion limiter may allow for the use of a much more gently-sloped high pass filter, because the excursion limiter may be tuned to guarantee that there will not be any damaging excursion below resonance. An excursion limiter that uses high-Q filters may have a narrow frequency range of effectiveness, but, when used with a woofer, may have excessive group delay in that frequency range, resulting in audible time-domain transient response problems.

SUMMARY OF DISCLOSURE

According to the present disclosure, a system for limiting the excursion of an audio speaker is provided. The system may include a first lowpass filter circuitry configured to receive a system input signal, the first lowpass filter circuitry configured to generate a first filtered output signal and to provide the first filtered output signal to a first combiner circuitry. The system may also include a clipping circuitry configured between the first lowpass filter circuitry and the first combiner circuitry. The system may further include a first highpass filter circuitry configured to receive the system input signal and to generate a second filtered output signal, the first highpass filter circuitry configured to provide the second filtered output signal to the first combiner circuitry. The system may also include a second lowpass filter circuitry configured to receive a combined output signal from the first combiner circuitry and to provide a third filtered output signal to second combiner circuitry. The system may additionally include an allpass filter circuitry configured to receive the system input signal and to generate a fourth filtered output signal. The system may also include a second highpass filter circuitry configured to receive the fourth filtered output signal from the allpass filter circuitry and to provide a fifth filtered output signal to the second combiner circuitry, the second combiner circuitry configured to generate an excursion limiting output signal.

One or more of the following features may be included. In some embodiments, at least one of the first and second lowpass filter circuitries and at least one of the first and second highpass filters circuitries may include a $3^{rd}$ order Butterworth filter. Additionally and/or alternatively, at least one of the first and second lowpass filter circuitries and at least one of the first and second highpass filter circuitries may include a $5^{th}$ order Butterworth filter.

In some embodiments, the first combiner circuitry may be configured as a subtractor. The first combiner circuitry may also be configured as an adder. The second combiner circuitry may be configured as an adder. The second combiner circuitry may also be configured as a subtractor.

In some embodiments, the allpass filter circuitry may include a first order allpass filter. Additionally and/or alternatively, the allpass filter circuitry may include a second order allpass filter. In some embodiments, the system may further include polarity circuitry configured between the allpass filter circuitry and the second highpass filter circuitry.

In another embodiment of the present disclosure, a method for limiting the excursion of an audio speaker is provided. The method may include receiving a system input signal at a first lowpass filter circuitry and generating a first filtered output signal at the first lowpass filter circuitry. The method may further include receiving the first filtered output signal at a first combiner circuitry. The method may also include clipping the first filtered output signal, via clipping circuitry between the first lowpass filter circuitry and the first combiner circuitry. The method may also include receiving the system input signal at the first highpass filter circuitry and generating a second filtered output signal at the first highpass filter circuitry. The method may additionally include receiving the second filtered output signal at the first combiner circuitry and combining, at the first combiner circuitry, the first filtered output signal and the second filtered output signal to generate a combined output signal. The method may further include receiving the combined output signal at the second lowpass filter circuitry, generating a third filtered output signal at the second lowpass filter circuitry and providing the third filtered output signal to a second combiner circuitry. The method may also include receiving the system input signal at an allpass filter circuitry and generating a fourth filtered output signal at the allpass filter circuitry. The method may additionally include receiving the fourth filtered output signal at a second highpass filter circuitry and generating a fifth filtered output signal at the second highpass filter circuitry and providing the fifth filtered output signal to the second combiner circuitry. The method may further include combining, at the second combiner circuitry, the third filtered output signal and the fifth filtered output signal to generate an excursion limiting output signal.

One or more of the following features may be included. At least one of the first and second lowpass filter circuitries and at least one of the first and second highpass filters circuitries may include a $3^{rd}$ order Butterworth filter. Additionally and/or alternatively, at least one of the first and second lowpass filter circuitries and at least one of the first and second highpass filter circuitries may include a $5^{th}$ order Butterworth filter.

In some embodiments, the method may further include subtracting, at the first combiner circuitry, the first output signal and the second output signal. The method may also include adding, at the second combiner circuitry, the third output signal and the fifth output signal. The method may additionally include adding, at the first combiner circuitry, the first output signal and the second output signal. The method may also include subtracting, at the second combiner circuitry, the third output signal and the fifth output signal.

In some embodiments, the allpass filter circuitry may include a first order allpass filter. Additionally, and/or alternatively, the allpass filter circuitry may include a second order allpass filter. The method may further include reversing a polarity of the fourth filtered output signal using polarity circuitry provided between the allpass filter circuitry and the second highpass filter circuitry.

The details of one or more implementations are set forth in the accompanying drawings and the description below. Other features and advantages will become apparent from the description, the drawings, and the claims.

BRIEF DESCRIPTION OF THE DRAWINGS

FIGS. 16A-16B depict a number of diagrams showing various responses generated by the excursion limiter of FIG. 2A.

DETAILED DESCRIPTION OF THE PREFERRED EMBODIMENTS

The present disclosure generally relates to a system and method for minimizing the excursion associated with an audio speaker. Embodiments of the present disclosure provide an excursion limiter topology that may have low group delay at low input levels, while minimizing unwanted excursion at high output levels.

Figure 1:
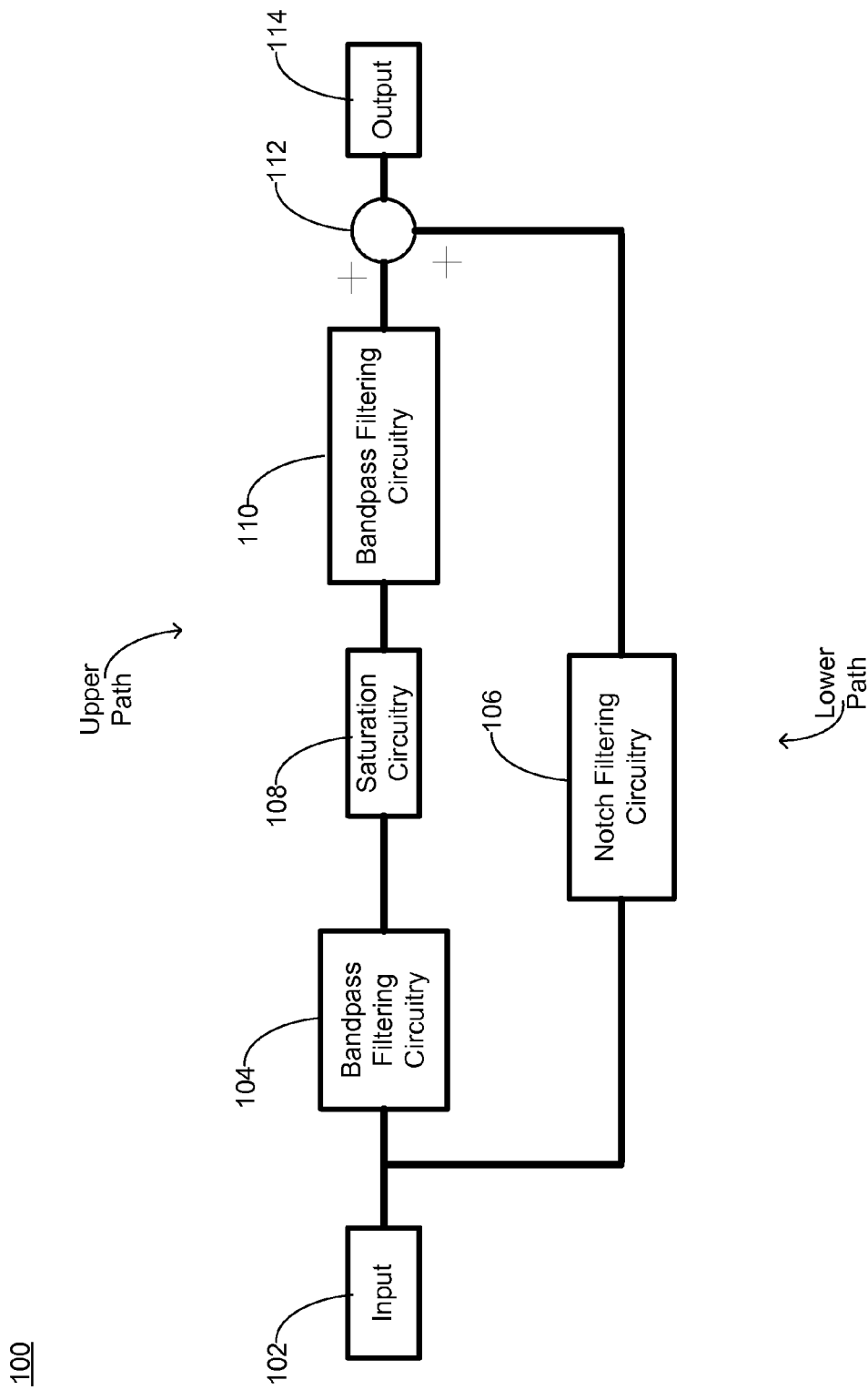
FIG. 1 depicts a block diagram showing an excursion limiter.

Referring now to FIG. 1, an embodiment depicting an excursion limiting system 100 is provided. Excursion limiting system 100 may be configured to receive an electrical input signal 102, which may be provided by an amplifier (not shown) via one or more signal lines. More specifically, input signal 102 may be received at first bandpass filtering circuitry 104 and notch filtering circuitry 106. First bandpass filtering circuitry 104 may be operatively connected with saturation circuitry 108. Second bandpass filtering circuitry 110 may be coupled with saturation circuitry 108 and may be configured to provide an output to combiner circuitry 112. Combiner circuitry 112 may also receive an output from notch filtering circuitry 106. Combiner circuitry 112 may generate an excursion limiting signal 114.

As used in any embodiment described herein, the term "circuitry" may comprise, for example, singly or in any combination, digital circuitry, analog circuitry, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

As used in any embodiment described herein, the terms "coupled" and "operatively connected", as used herein, may refer to one or more components that are configured to communicate a signal. The coupled components may be physically connected by electrically conductive wire or by optically transmissive fiber, or may be communicatingly coupled by a wireless technique such as infrared or radio frequency (RF), or other signal communication techniques. Similarly, the term "signal line" as used herein, may refer to any transmissive path, including electrically conductive wire, optically transmissive fiber, a wireless communication path, or other type of signal transmission path, for transmitting analog or digitally encoded signals.

In some embodiments, first and second bandpass filtering circuitry 104, 110 may be used within excursion limiting system 100 to provide excursion limiting in a specific frequency range, above and below that range the excursion limiter may be transparent. First and second bandpass filtering circuitry 104, 110 may include, but are not limited to, $2^{nd}$ order Butterworth filters. Notch filtering circuitry 106 may be configured in a number of different arrangements, for example, as a $4^{th}$ order Linkwitz-Riley filter, which may be configured as a cascade of two $2^{nd}$ order Butterworth filters. In some embodiments, notch filtering circuitry 106 and the first and second bandpass filtering circuitry 104, 110 may have the same cutoff or corner frequencies. Saturation circuitry 108 may operate as a clipping block, which may be configured to clip the amplitude of the signal entering the clipping block if it as above or below a predefined threshold.

In operation, at low input levels, first and second bandpass filtering circuitry 104, 110 and notch filtering circuitry 106 may function as a perfectly reconstructing set. In other words, the combined magnitude response may be flat or substantially flat, with just an overall phase response through the system. At high input levels, when the frequency is near the center of the cutoff frequency of filtering circuitry 104, 110, and 106, most of the signal may be rejected from the lower path by notch filtering circuitry 106. In the upper path, the signal may pass through first bandpass filtering circuitry 104 and may be clipped by saturation circuitry 108, which may result in generating a clipped fundamental plus odd-order harmonics. In some cases, the amount and amplitude of the harmonics may depend on the input level and the clipping threshold of saturation circuitry 108. The harmonics may then be filtered out of the signal by the second bandpass filtering circuitry 110, leaving primarily the clipped fundamental.

Figure 2A:
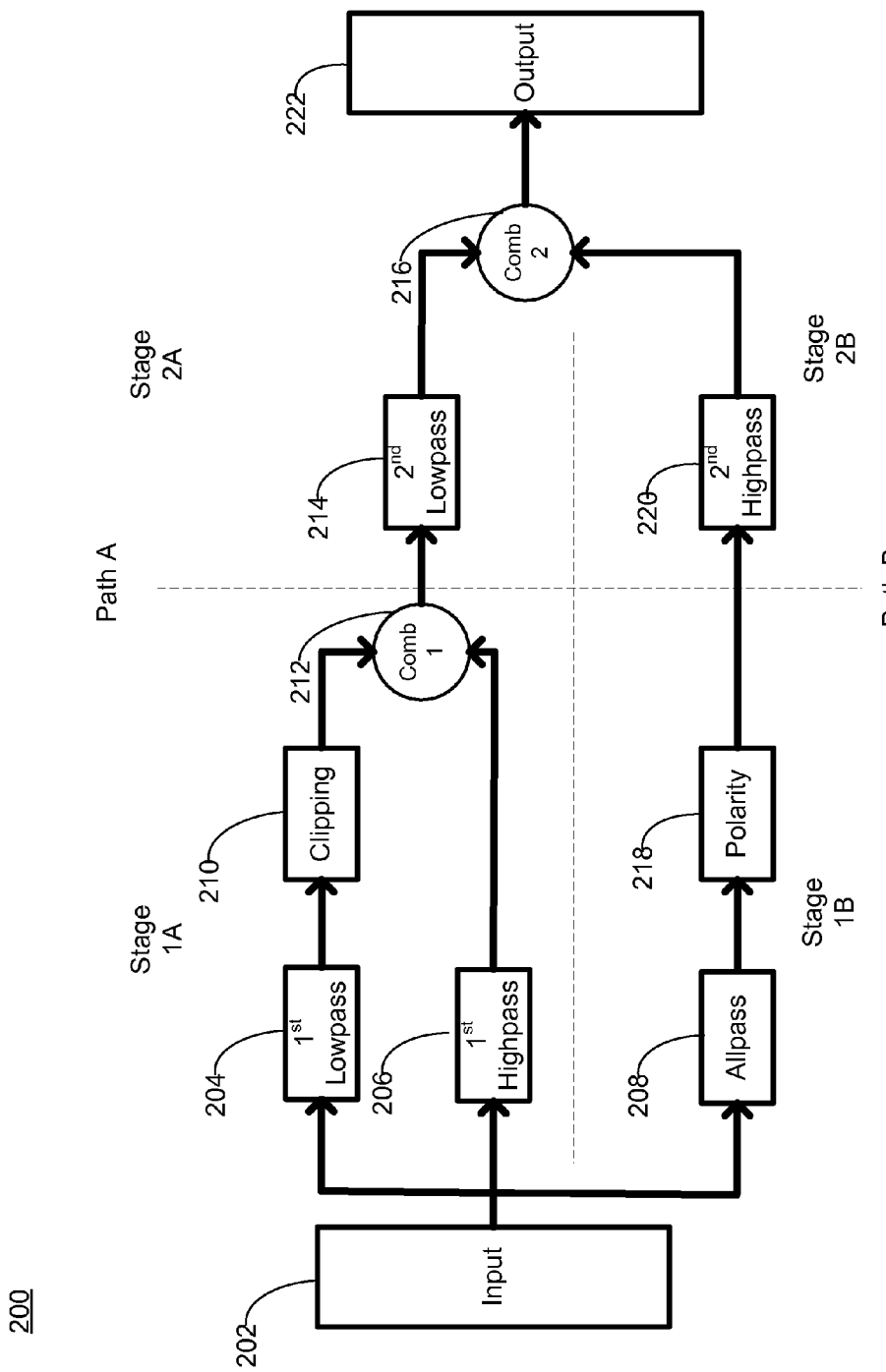
FIG. 2A depicts a block diagram showing an excursion limiter consistent with embodiments of the present disclosure.

Referring also to FIG. 2A, an embodiment of the present disclosure depicting excursion limiting system 200 is provided. In some embodiments, excursion limiting system 200 may be configured to minimize excursion over an entire band of audio inputs, as opposed to only a bandpass region.

The system of FIG. 2A is shown as a block diagram. In FIG. 2A there may or may not be physical elements corresponding to each of the elements of FIG. 2A. For example, system input signal 202 may be received at one or more input terminals (not shown), which may be implemented as a single physical input terminal receiving a stream of signals. Elements such as the lowpass filtering circuitries, highpass filtering circuitries, or others, may be implemented by a digital signal processor (DSP) operating on digitally encoded data. Additionally and or alternatively, other circuit arrangements may produce substantially the same result as the arrangement of FIG. 2A. More than one of the blocks may be represented by a single element, or blocks may be consolidated.

System 200, as depicted in FIG. 2A, is shown divided into two paths and four distinct stages. Path "A" may refer to the signal lines and components included within the upper portions of excursion limiting system 200, i.e., Stage 1A and Stage 2A (the upper portions being those included above the horizontal dashed line shown in FIG. 2A). Path "B" may refer to the signal lines and components included within the lower portions of excursion limiting system 200, i.e., Stage 1B and Stage 2B (the lower portions being those included below the horizontal dashed line shown in FIG. 2A).

In some embodiments, excursion limiting system 200 may be configured to receive a system input signal 202, which may be provided by an amplifier (not shown) or alternative device through one or more signal lines. Electrical input 202 may be provided to each of first lowpass filter circuitry 204 and first highpass filter circuitry 206 along Path "A". System input signal 202 may also be provided to allpass filter circuitry 208 along Path "B". First lowpass filter circuitry 204 may be operatively connected to clipping circuitry 210, which may be configured to clip the amplitude of the signal entering the clipping block if it is above or below a predefined threshold. Clipping circuitry 210 may be a bipolar clipper or some other form of clipper that limits the amplitude of a signal in a particular frequency band. First combiner circuitry 212 may be operatively connected to clipping circuitry 210, first highpass filter circuitry 206, and second lowpass filter circuitry 214. Second lowpass filter circuitry 214 may be operatively connected to second combiner circuitry 216.

As discussed above, allpass filter circuitry 208 may receive system input signal 202 through one or more signal lines along Path B. Allpass filter circuitry 208 may be operatively connected to polarity circuitry 218. Polarity circuitry 218 may be operatively connected to second highpass filter circuitry 220. Second combiner circuitry 216 may receive an input from each of second lowpass filter 214 (along Path A) and second highpass filter 220 (along Path B). The output of second combiner circuitry 216 may result in an excursion limiting output signal 222.

In some embodiments, one or more of first lowpass filter circuitry 204, second lowpass filter circuitry 214, first highpass filter circuitry 206, and second highpass filter circuitry 220 may be configured as a Butterworth filter. However, numerous other filter types may be used without departing from the scope of this disclosure. Some of these may include, but are not limited to, Chebyshev, Elliptic, Bessel, Gaussian, Legendre, Linkwitz-Riley, etc.

In some embodiments, one or more of first lowpass filter circuitry 204, second lowpass filter circuitry 214, first highpass filter circuitry 206, second highpass filter circuitry 220, and allpass filter circuitry 208 may have the same or substantially similar corner frequencies. For the purposes of this discussion, the corner frequency may refer to the frequency at which attenuation begins to increase sharply; or for the allpass filter, its corner frequency may be where its phase has traversed half of its full phase change (for $1^{st}$ order, that phase is 90 degrees; for $2^{nd}$ order, that phase is 180 degrees).

In some embodiments, first lowpass filtering circuitry 204 and first highpass filtering circuitry 206 may be complementary filters. The sum (or difference) of the outputs of first lowpass filtering circuitry 204 and first highpass filtering circuitry 206 may result in a perfect magnitude reconstruction having only a resultant phase delay. Any or all of the filtering circuitries described herein, such as first lowpass filtering circuitry 204 and first highpass filtering circuitry 206, may be configured as odd ordered filters, which may include, but are not limited to, $3^{rd}$ or $5^{th}$ order filters. Other configurations are also within the scope of the present disclosure.

In some embodiments, clipping circuitry 210 may be configured to decrease the amplitude of the signal entering clipping circuitry 210 if it is above a specific, maximum, predefined threshold. A decrease in the threshold of clipping circuitry 210 may result in a lower resultant output from excursion limiting system 200.

In some embodiments, first combiner circuitry 212 may be configured to either add or subtract the outputs from first lowpass filtering circuitry 204 (e.g., which may or may not be processed by clipping circuitry 210) and first highpass filtering circuitry 206. First lowpass filtering circuitry 204 and first highpass filtering circuitry 206 may have 90 degrees, or approximately 90 degrees, of phase difference between them, thus adding or subtracting signals may yield the same or a similar magnitude output. The polarity of first combiner circuitry 212 may effect the overall group delay as well as non-linear reconstruction as is discussed in further detail below.

In some embodiments, allpass filtering circuitry 208 may be configured to provide phase compensation to Path B. This phase compensation may be selected in order to align the phase of Path B with the phase of Path A, i.e., the sum of the outputs of first lowpass filtering circuitry 204 and first highpass filtering circuitry 206. For example, if first lowpass filtering circuitry 204 and first highpass filtering circuitry 206 are $3^{rd}$ order filters, allpass filtering circuitry 208 may be a $1^{st}$ order allpass filter having a Q factor of Q=0. In the example of the $1^{st}$ order allpass filter, the natural phase response may result in an inverted output at DC. Polarity circuitry 218 may then be configured to correct this inverted output. Additionally and/or alternatively, if first lowpass filtering circuitry 204 and first highpass filtering circuitry 206 are $5^{th}$ order filters, allpass filtering circuitry 208 may be a $2^{nd}$ order allpass filter having a Q factor of Q=0.618.

In some embodiments, second lowpass filtering circuitry 214 and second highpass filtering circuitry 220 may be complementary filters. Accordingly, the sum of the outputs of second lowpass filtering circuitry 214 and second highpass filtering circuitry 220 may result in a perfect magnitude reconstruction having only a resultant phase delay. Second lowpass filtering circuitry 214 and second highpass filtering circuitry 220 may be configured as odd ordered filters, including, but not limited to, $3^{rd}$ or $5^{th}$ order filters. Other configurations are also within the scope of the present disclosure.

In some embodiments, second combining circuitry 216 may be configured to receive input from second lowpass filtering circuitry 214 and second highpass filtering circuitry 220. Second combining circuitry 216 may be configured to either add or subtract these two outputs. Second lowpass filtering circuitry 214 and second highpass filtering circuitry 220 may have 90 degrees, or approximately 90 degrees, of phase difference between them, thus adding or subtracting signals may yield the same or a similar magnitude output. The polarity of second combiner circuitry 216 may effect the overall group delay as well as non-linear reconstruction as is discussed in further detail below.

Figure 2B:
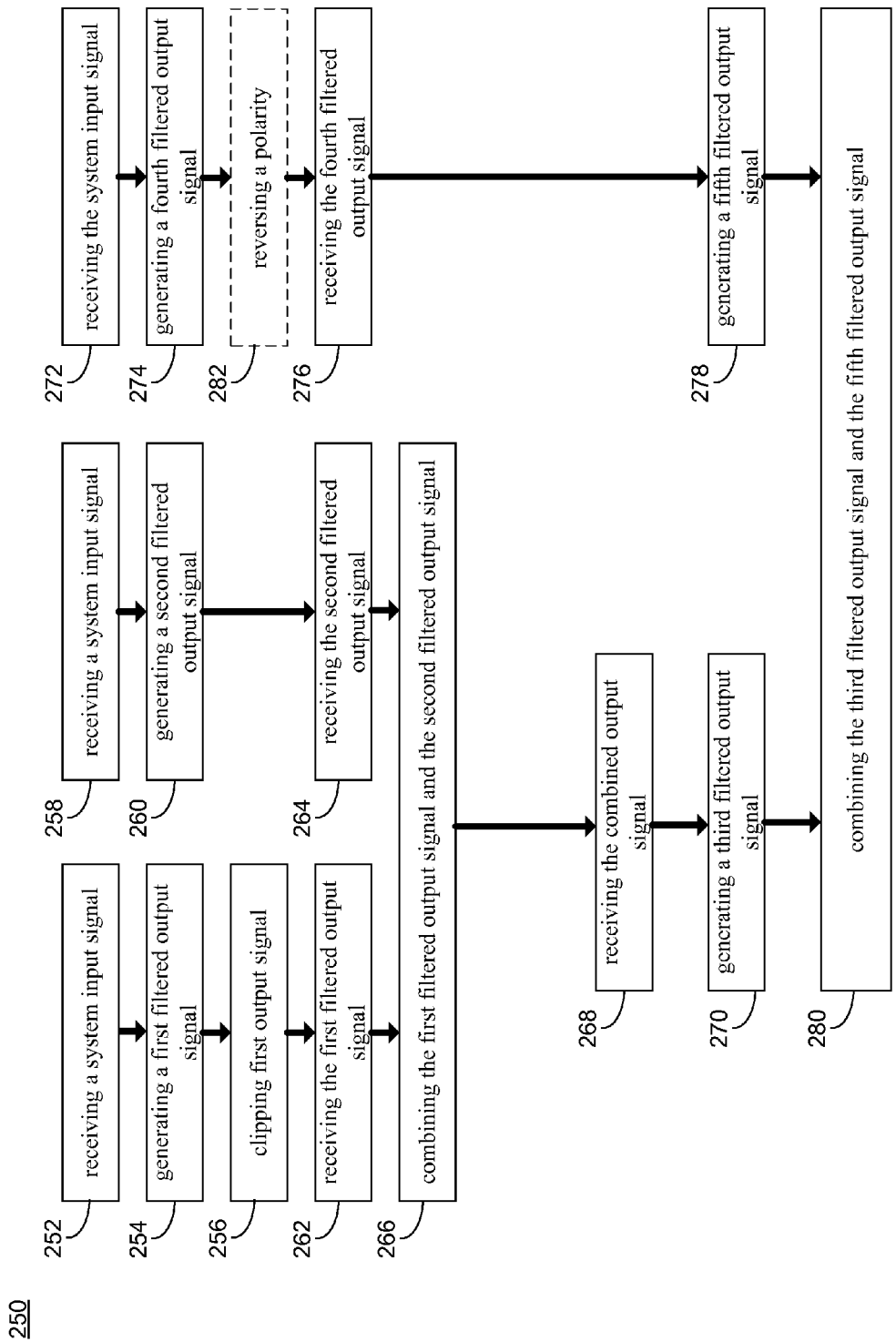
FIG. 2B depicts a flowchart showing operations associated with a method consistent with the present disclosure.

Referring also to FIG. 2B and in operation, a method 250 for limiting the excursion of an audio speaker may include receiving 252 system input signal 202 at first lowpass filter circuitry 204 (along path A). System input signal 202 may be transmitted along one or more signal lines from another device, e.g. an amplifier, to first lowpass filter circuitry 204. First lowpass filter circuitry 204 may receive system input signal 202 and may generate 254 a first filtered output signal. The first filtered output signal may be transmitted along one or more signal lines to clipping circuitry 210. Clipping circuitry 210 may clip 256, i.e., reduce the amplitude, of the first filtered output signal to lower it below a predetermined threshold value. Additionally or alternatively, the first filtered output signal may be transmitted directly to first combiner circuitry 212.

The method may further include receiving 258 system input signal 202 at first highpass filter circuitry 206. First highpass filter circuitry 206 may generate 260 a second filtered output signal and may transmit the second filtered output signal to first combiner circuitry 212. First combiner circuitry 212 may receive 262, 264 the first filtered output signal and the second filtered output signal, which may be combined 266 to generate a combined output signal. Combining 266 the first filtered output signal and the second filtered output signal may include adding or subtracting the two signals.

The combined output signal may be transmitted by first combiner circuitry 212, along one or more signal lines, to second lowpass filter circuitry 214. Second lowpass filter circuitry 214 may receive 268 the combined output signal and may generate 270 a third filtered output signal. Second lowpass filter circuitry 214 may provide the third filtered output signal to second combiner circuitry 216.

Along Path B, method 250 may further include receiving 272 system input signal 202 at allpass filter circuitry 208. As discussed above, allpass filter circuitry 208 may be configured in a number of different arrangements, e.g. as a $1^{st}$ order filter, $2^{nd}$ order filter, etc. Allpass filter circuitry 208 may adjust the phase of system input signal 202 and may generate 274 a fourth filtered output signal. Fourth filtered output signal may be transmitted from allpass filter circuitry 208 to polarity circuitry 218 and/or second highpass filter circuitry 220. Polarity circuitry 218 may reverse the polarity of the fourth filtered output signal before transmission to second highpass filter circuitry 220. Second highpass filter circuitry 220 may receive 276 the fourth filtered output signal and may generate 278 a fifth filtered output signal. Fifth filtered output signal may be provided to the second combiner circuitry 216. Second combiner circuitry 216 may receive and combine 280 the third filtered output signal and the fifth filtered output signal in order to generate excursion limiting output signal 222. Combining the third filtered output signal and the fifth filtered output signal may include adding or subtracting the two signals. The reasoning underlying the selection of whether to add or subtract is described in further detail below.

As discussed above, system 200 may include clipping circuitry 210. Accordingly, method 250 may be configured to clip the first output signal provided by first lowpass filter circuitry 204 prior to providing the same to first combiner circuitry 212. Further and as discussed above, system 200 may include polarity circuitry 218. Accordingly, method 250 may be configured to reverse 282 the polarity of the fourth filtered output signal provided by allpass filter circuitry 208 prior to providing the same to second highpass filter circuitry 220.

Referring now to FIGS. 3-9, a number of diagrams showing the magnitude response, phase response, and group delay of various sections of system 200 are provided. In this particular embodiment, lowpass filter circuitries 204 and 214 and highpass filter circuitries 206 and 220 were configured as $3^{rd}$ order filters. As the present disclosure is not meant to be limited to the $3^{rd}$ order case, the following analysis is provided merely for exemplary purposes.

Figure 3B:
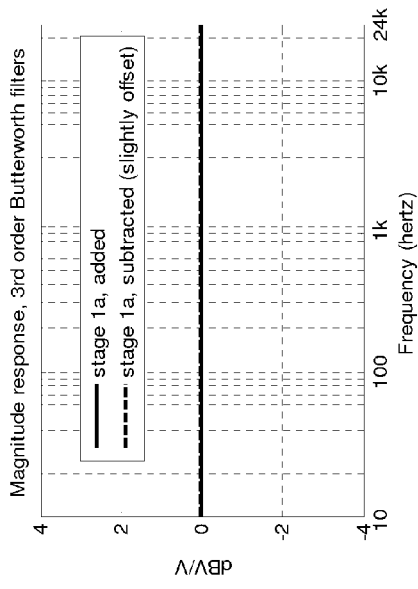
FIGS. 3A-3D depict a number of diagrams showing various responses generated by the excursion limiter of FIG. 2A.
Figure 3D:
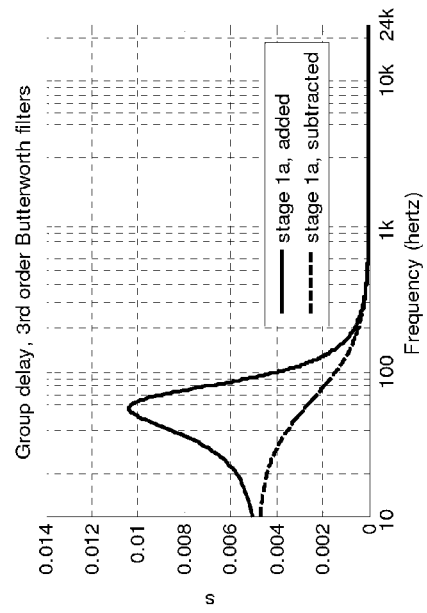
Figure 3A:
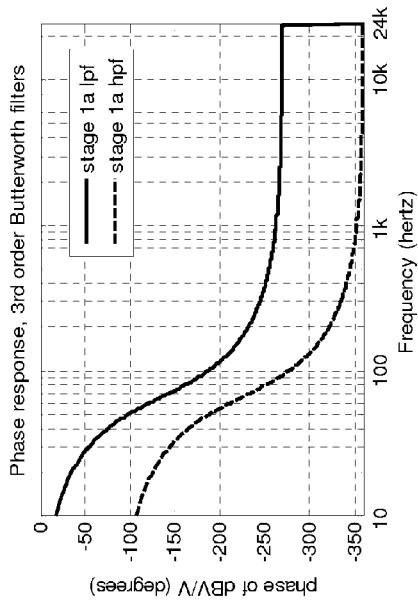
Figure 3C:
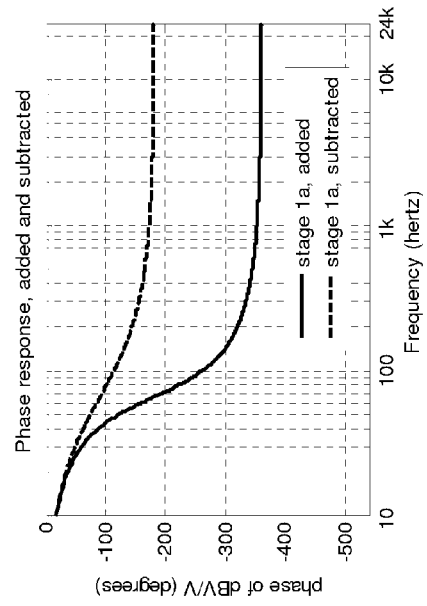
Figure 4:
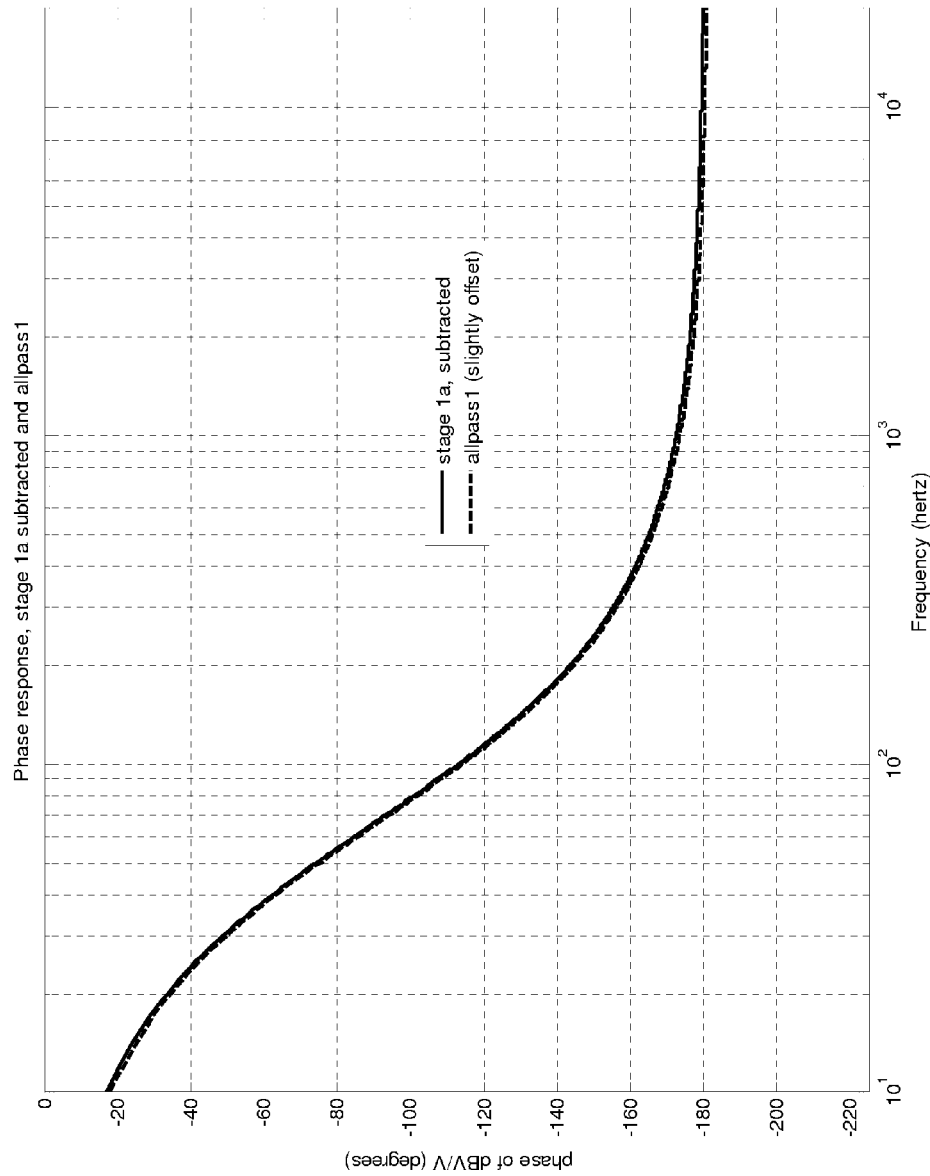
FIG. 4 depicts a diagram showing a response generated by the excursion limiter of FIG. 2A.

FIGS. 3-5 show the results for the linear range operation and FIGS. 6-9 show the results for operation in a non-linear range. In this particular embodiment, the input levels are below the predetermined threshold associated with clipping circuitry 210. A corner frequency of 66 Hz was selected for first lowpass filter circuitry 204, first highpass filter circuitry 206, second lowpass filter circuitry 214, and second highpass filter circuitry 220. Allpass filter circuitry 208 is a real allpass filter at 66 Hz with a Q=0, and polarity circuitry 218 was set to −1 to account for allpass filter circuitry 208 inverting at low frequencies.

Referring now to FIGS. 3A-3D, a number of diagrams 300 showing the magnitude and phase response of the filtering circuitry associated with Stage 1A are provided. FIG. 3A shows the phase response of first lowpass filtering circuitry 204 and first highpass filtering circuitry 206. As shown in FIG. 3A, first lowpass filtering circuitry 204 and first highpass filtering circuitry 206 are 90 degrees out-of-phase. As a result, first combiner circuitry 212 may generate the same magnitude response, regardless of whether first combiner circuitry 212 is configured as an adder or as a subtractor. The resultant magnitude plot is shown in FIG. 3B. Referring now to FIG. 3C, the resultant phase responses generated when first combiner circuitry 212 is configured as both an adder and as a subtractor is provided. As shown in FIG. 3C, if first combiner circuitry 212 is configured as an adder, the phase shift is far higher than if it is configured as a subtractor. This corresponds with the phase response shown in FIG. 3A. In FIG. 3A, first lowpass filtering circuitry 204 starts at 0 degrees, then at high frequencies first highpass filtering circuitry 206 dominates the output. The transition moves from 0 degrees to either −180 degrees or −360 degrees, depending on whether addition or subtraction is used. Referring now to FIG. 3D, the group delay is shown when configuring first combiner circuitry 212 as an adder and also as a subtractor. As shown in FIG. 3C, if first combiner circuitry 212 is configured as an adder, there is a much higher group delay, as expected, because there is more phase change in that branch.

Referring now to FIG. 4, a diagram 400 showing the phase response of Stage 1A is provided. More specifically, diagram 400 shows the phase response of Stage 1A (in dBV/V (degrees) vs. the frequency (hertz)) when first combiner circuitry 212 is configured as a subtractor. As discussed above, allpass circuitry 208 may be configured to compensate the phase of the signal going through Stage 1B. As shown in FIG. 4, these two responses may be substantially similar or identical.

Figure 5B:
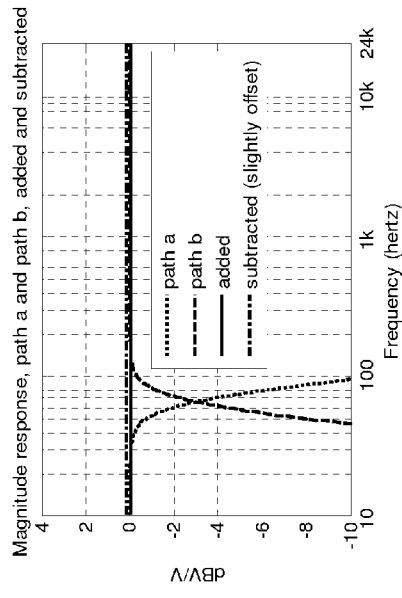
FIGS. 5A-5D depict a number of diagrams showing various responses generated by the excursion limiter of FIG. 2A.
Figure 5D:
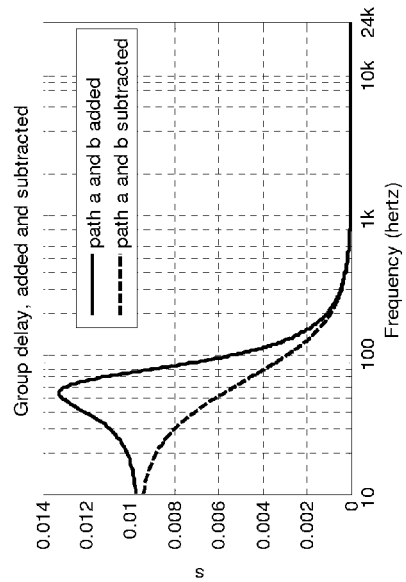
Figure 5A:
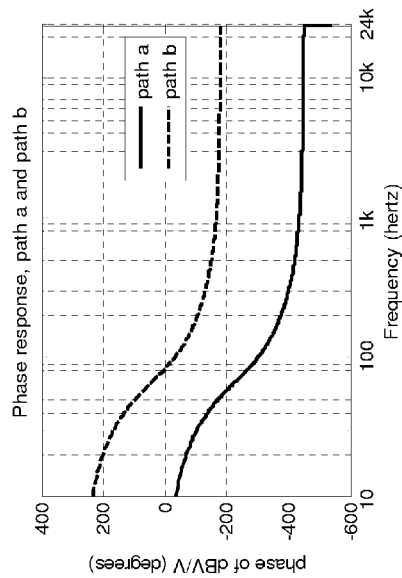
Figure 5C:
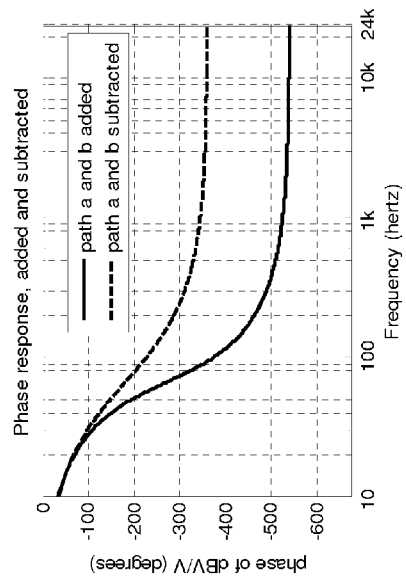

Referring now to FIGS. 5A-5D, a number of diagrams 500 showing the magnitude and phase response along Paths A and B of system 200 are provided. As discussed above, Path A may refer to the cascade of Stage 1A and Stage 2A, and Path B may refer to the cascade of Stage 1B and Stage 2B. FIG. 5A shows the overall phase response of each of the paths. In this particular example, the response of each path may be approximately 270 or 90 degrees out-of-phase, the result being dependent upon whether second combiner circuitry 216 is configured as an adder or a subtractor. FIG. 5B shows the overall magnitude response for Path A, Path B, Path A+Path B, and Path A−Path B. Essentially, Path A is a lowpass path, Path B is a high pass path, and the sum or difference may yield an equivalent flat magnitude response. FIG. 5C shows the phase response when second combiner circuitry 216 is configured as an adder and as a subtractor. FIG. 5D shows the group delay when second combiner circuitry 216 is configured as an adder and as a subtractor. This Figure seems to indicate that configuring second combiner circuitry 216 as a subtractor minimizes overall group delay for linear range operation.

Therefore, if $3^{rd}$-order filters are used, first combiner circuitry 212 and second combiner circuitry 216 may be configured as subtracting blocks. However, this analysis relates to linear range analysis, further analysis reviewing the overall response in a non-linear region is provided below.

As discussed above, the analysis shown in FIGS. 3-5 involved operation in a linear range. Any effect produced by clipping circuitry 210 was disregarded and linear time-invariant operation was assumed. However, as the level of system input signal 202 approaches and/or exceeds the predetermined threshold of clipping circuitry 210, the results may differ as is discussed in further detail below with reference to FIGS. 6-9.

Referring now to FIG. 6, a number of diagrams 600 showing the magnitude and phase response along Paths A and B of system 200 are provided. As discussed above, Path A may refer to the cascade of Stage 1A and Stage 2A, and Path B may refer to the cascade of Stage 1B and Stage 2B. In this particular example, assume a system input signal 202 greater than the threshold of clipping circuitry 210. For a very low frequency, Path B may pass essentially no signal, because it may be blocked by the second highpass filtering circuitry 220. In Path A, the first highpass filtering circuitry 206 may operate essentially as an open circuit, and the entire signal may essentially flow through first lowpass filtering circuitry 204, which for frequencies much lower than its corner frequency is essentially unity gain, into clipping circuitry 210. At this point, odd-order harmonics may be generated by clipping circuitry 210, while the fundamental frequency may be clipped to approximately the level of the saturation threshold of clipping circuitry 210. As the input signal increases to higher levels, the fundamental may stay the same, however the harmonics series may grow longer, and the harmonics may increase in amplitude. All of these harmonics (and the fundamental) may then flow into second lowpass filtering circuitry 214, which may significantly attenuate them, leaving the capped-off fundamental as the resultant excursion limiting signal 222.

Similarly, at very high frequencies, system input signal 202 may pass completely through Path B with some phase delay through the filtering circuitry. The signal may also pass through first highpass filtering circuitry 206, but may then be blocked by second lowpass filtering circuitry 214. At intermediate frequencies, e.g., around the area of the corner frequency, there may be a hand-off in the amount of output going through Path A and Path B. At low levels (i.e., much below the clipping level), the output level may be unaffected at any frequency, but as the amplitude of system input signal 202 increases to the threshold of clipping circuitry 210, the low frequencies may be limited by clipping circuitry 210 and second lowpass filtering circuitry 214, while the high frequencies may pass through undisturbed. To see the effect of this, Path A and Path B may be combined in a series of operations such that the threshold for clipping circuitry 210 is stepped from approximately 0 to approximately 1. Path A and Path B may be either added or subtracted, the results of which are provided below.

Figure 6C:
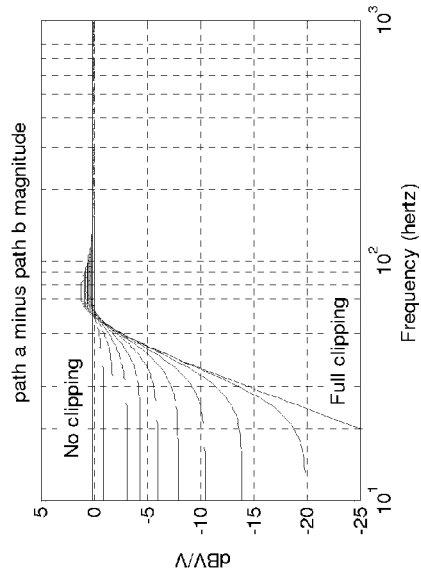
FIGS. 6A-6D depict a number of diagrams showing various responses generated by the excursion limiter of FIG. 2A.
Figure 6D:
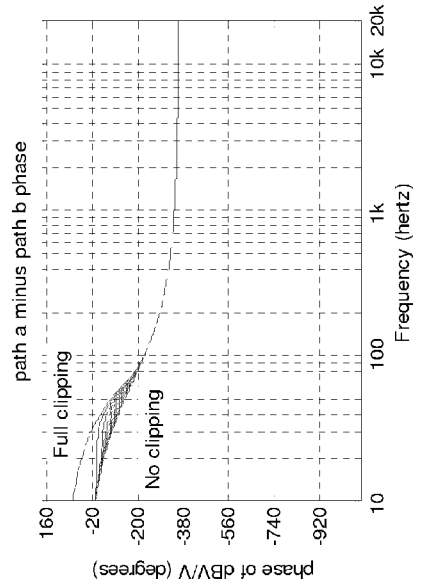
Figure 6A:
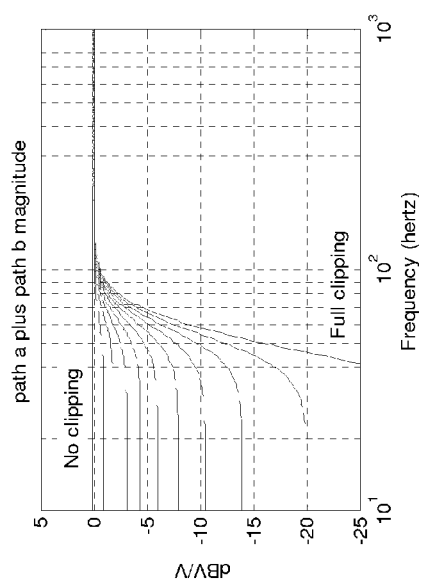
Figure 6B:
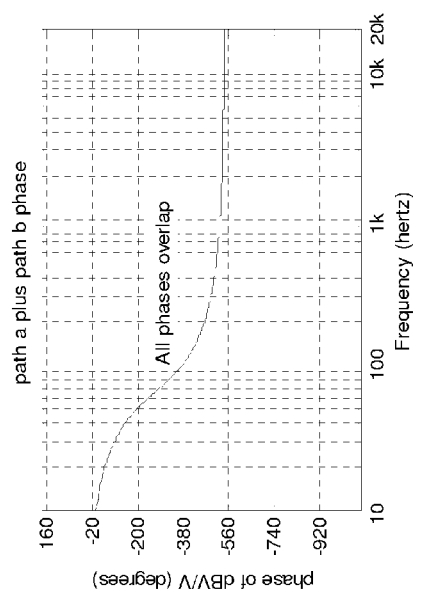

FIGS. 6A and 6B show the magnitude and phase response, respectively, when Path A and Path B are added by second combiner circuitry 216. Similarly, FIGS. 6C and 6D show the magnitude and phase response, respectively, when Path A and Path B are subtracted by second combiner circuitry 216. For the case of subtraction, there appears to be some imperfect reconstruction, as evidenced by the ripple in the magnitude response and the phase response which varies depending on the threshold. Alternatively, the addition case appears to have a much better response, with little to no ripple, and a consistent phase regardless of threshold. Further, the magnitude response in the addition case shows that there may be more attenuation in the crossover region than the magnitude response in the subtraction case.

Figure 7:
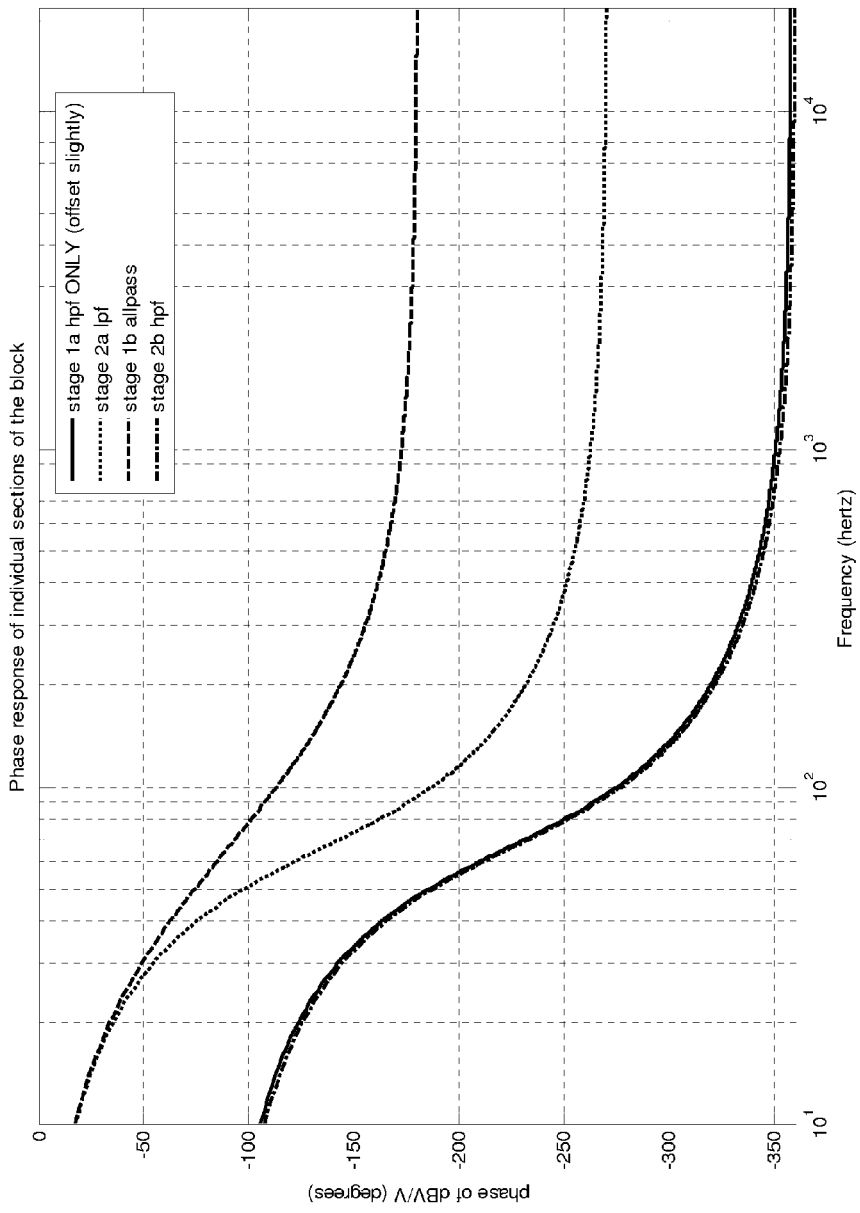
FIG. 7 depicts a diagram showing a response generated by the excursion limiter of FIG. 2A.

Referring now to FIG. 7, a diagram 700 depicting the phase response of various individual sections of excursion limiting system 200 is provided. Specifically, FIG. 7 provides the phase response for first highpass filtering circuitry 206 only, second lowpass filtering circuitry 214, allpass filtering circuitry 208, and second highpass filtering circuitry 220. Allpass filtering circuitry 208 in Stage 1B may be designed to match the phase response of the linear sum of the components in Stage 1A. However, when clipping circuitry 210 is limiting the signal from first lowpass filtering circuitry 204, there may be a mis-match in the phase response between Path A and Path B. As shown in FIG. 7, the phase of allpass filtering circuitry 208 may begin at 0 degrees, and decrease by 180 to −180 degrees, while first highpass filtering circuitry 206 only, second lowpass filtering circuitry 214, and second highpass filtering circuitry 220 may start at −90 degrees and decrease by 270 degrees to −360.

Figure 8A:
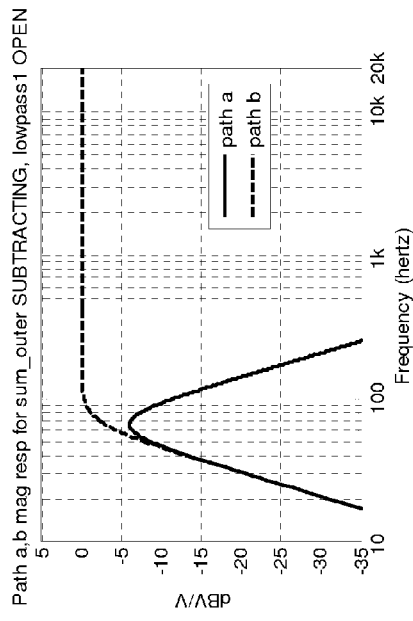
FIGS. 8A-8D depict a number of diagrams showing various responses generated by the excursion limiter of FIG. 2A.
Figure 8C:
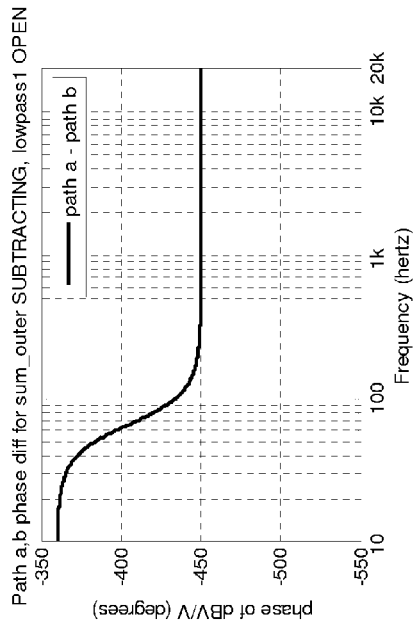
Figure 8B:
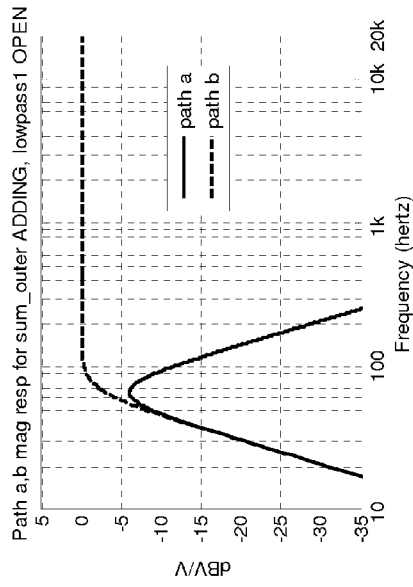
Figure 8D:
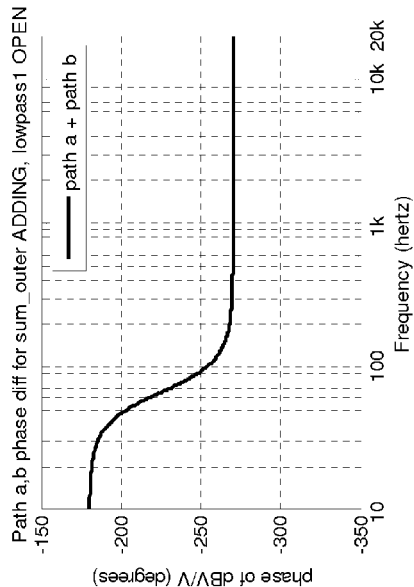

Referring now to FIGS. 8A-8D, a number of diagrams 800 depicting the magnitude and phase response of excursion limiting system 200 when second combiner circuitry 216 is configured as an adder and also as a subtractor are provided. In this particular example, assume that system input signal 202 has a frequency in the transition region, and that the amplitude is large, so that the signal flowing through first highpass filtering circuitry 206 of Stage 1A may be much larger than the signal transmitted through first lowpass filtering circuitry 204 and clipping circuitry 210. FIGS. 8A-8B show the magnitude and phase responses, respectively, for Path A and Path B when second combiner circuitry 216 is configured as an adder. Alternatively, FIGS. 8C-8D show the magnitude and phase responses for Path A and Path B when second combiner circuitry 216 is configured as a subtractor.

The magnitude response for Path A in both cases appears similar to a bandpass, and Path B appears similar to a highpass. Notice that the phase responses between the adding and subtracting cases are slightly different. If second combiner circuitry 216 is configured as an adder, the phase difference may be approximately −180 degrees at the low end, and −270 degrees at the high end. If second combiner circuitry 216 is configured as a subtractor, the phase difference may be approximately −360 degrees at low frequencies, and approximately −450 degrees at high frequencies. This has important implications for the amount of attenuation at low frequencies. In other words, when second combiner circuitry 216 is configured as an adder, Path A and Path B may be out-of-phase. There may be high attenuation of the signal, giving good rejection of low frequencies through Path A, which may allow a controlled amount of the signal to pass through first lowpass filtering circuitry 204 and clipping circuitry 210.

Figure 9A:
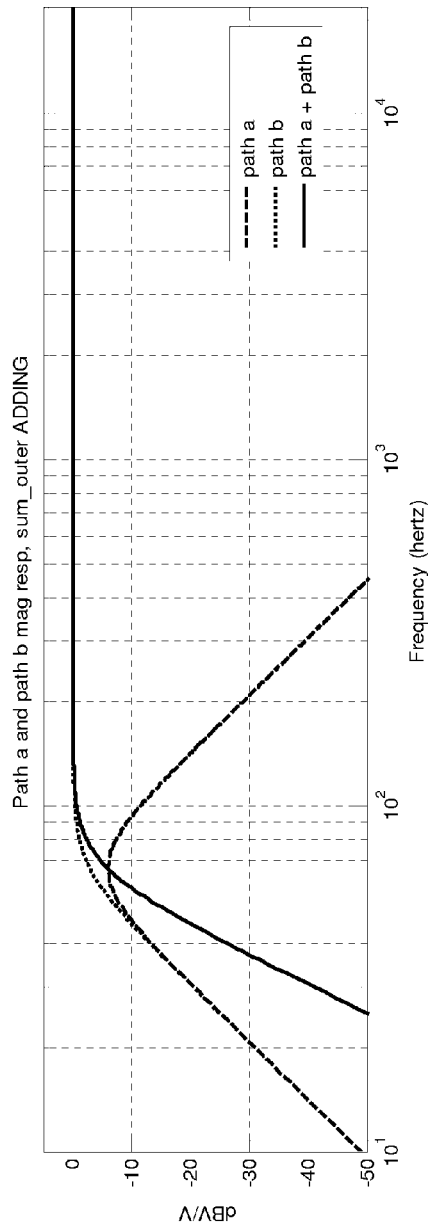
FIGS. 9A-9B depict a number of diagrams showing various responses generated by the excursion limiter of FIG. 2A.
Figure 9B:
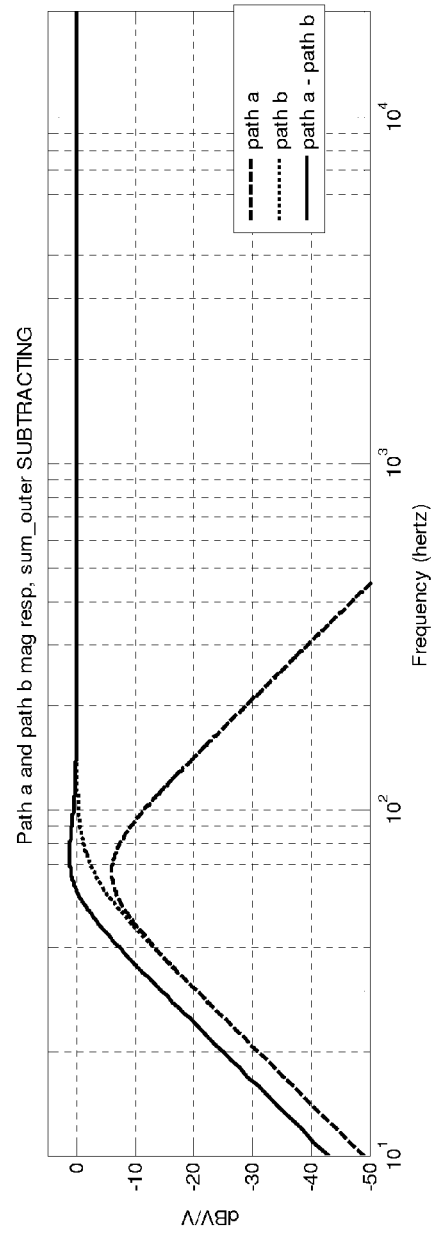

Referring now to FIGS. 9A-9B, a number of diagrams 900 are provided depicting the magnitude response when second combiner circuitry 216 is configured as an adder and also as a subtractor. FIG. 9A shows the linear sum of Path A and Path B with second combiner circuitry 216 configured as an adder, FIG. 9B shows the linear sum with second combiner circuitry 216 configured as a subtractor. FIG. 9A shows a cancellation of the linear sum below the corner frequency, while, in contrast, in FIG. 9B the signal has a bit of a bump at the transition region, and does not decrease below the corner frequency nearly as quickly. In this example, if second combiner circuitry 216 is configured as a subtractor, Path A and Path B may each be at 90 degrees below the corner frequency, so the paths do not result in any cancellation due to phase.

As a result, even though the arrangement of first combiner circuitry 212 configured as a subtractor and second combiner circuitry 216 configured as an adder for $3^{rd}$-order filters may not be the configuration that gives the least overall group delay in the linear range, it may result in an improved performance as an excursion limiter. This configuration may result in less leakage of low frequency components through system 200, as shown above.

Referring now to FIGS. 10-16, a number of diagrams of the magnitude response, phase response, and group delay of various sections of system 200 are provided. In this particular embodiment, lowpass filter circuitries 204 and 214 and highpass filter circuitries 206 and 220 were configured as $5^{th}$ order filters. As the present disclosure is not meant to be limited to the $5^{th}$ order case, the following analysis is provided merely for exemplary purposes.

Figure 10A:
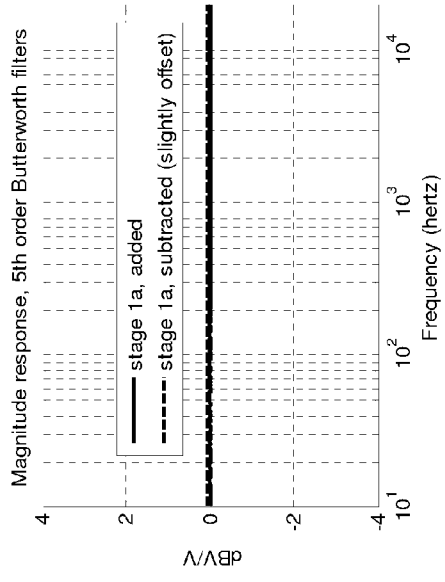
FIGS. 10A-10D depict a number of diagrams showing various responses generated by the excursion limiter of FIG. 2A.
Figure 10B:
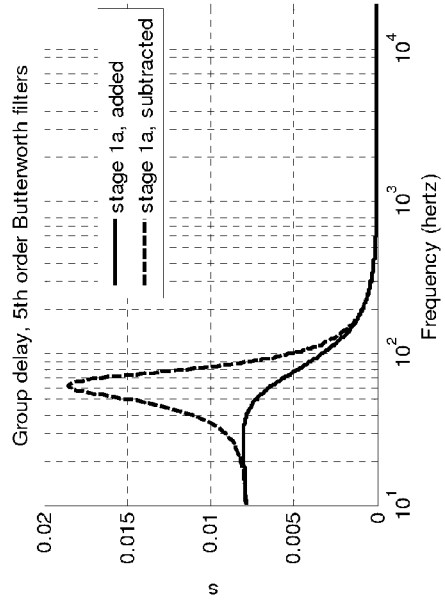
Figure 10C:
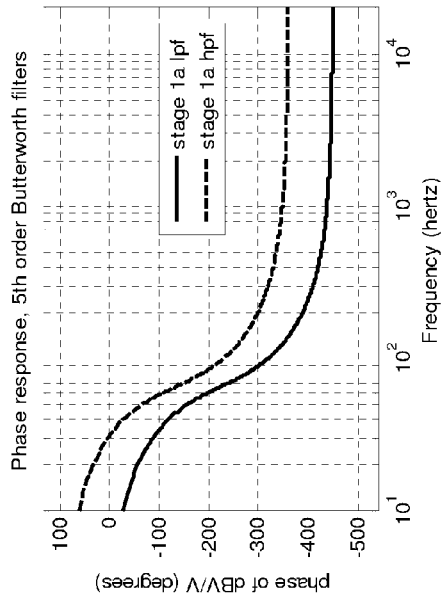
Figure 10D:
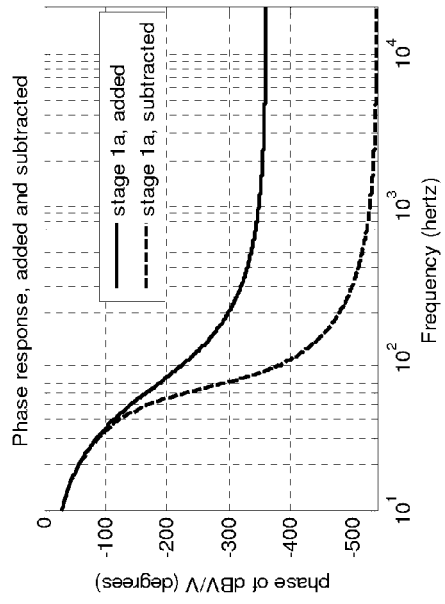
Figure 11:
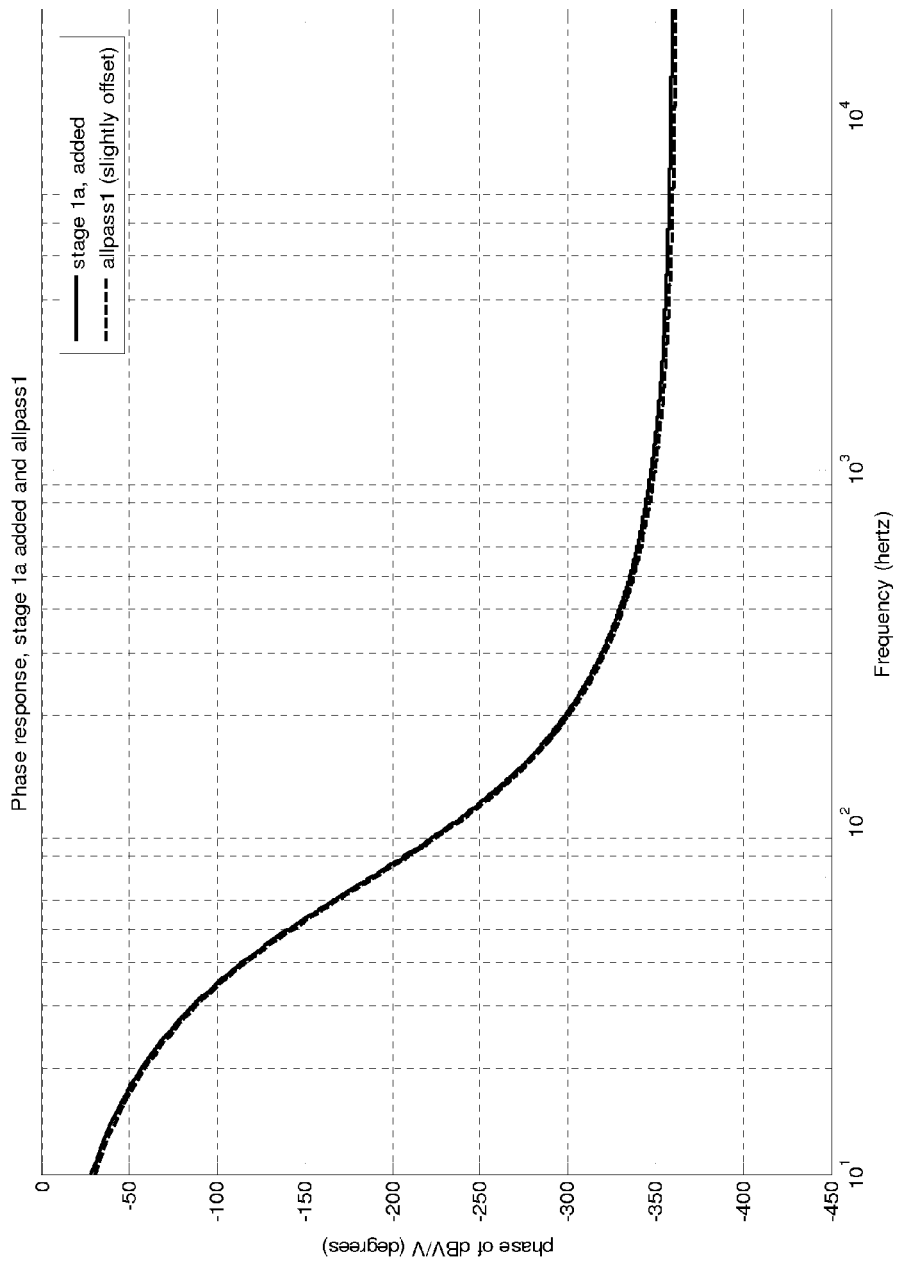
FIG. 11 depicts a diagram showing a response generated by the excursion limiter of FIG. 2A.

FIGS. 10-12 show the results for the linear range operation and FIGS. 13-16 show the results for operation in a non-linear range. In this particular embodiment, the input levels are below the predetermined threshold associated with clipping circuitry 210. Again, a corner frequency of 66 Hz was selected for first lowpass filter circuitry 204, first highpass filter circuitry 206, second lowpass filter circuitry 214, and second highpass filter circuitry 220. Allpass filter circuitry 208 may be a $2^{nd}$ order allpass at 66 Hz with a Q=0.618, and polarity circuitry 218 may be set to +1. Since a $2^{nd}$ order allpass circuit may start at phase 0 at low frequencies, it may not require inversion. In this particular embodiment, first combiner circuitry 212 may be configured as an adder and second combiner circuitry 216 may be configured as a subtractor.

Referring now to FIGS. 10A-10D, a number of diagrams 1000 are provided depicting the magnitude and phase response of first lowpass filter circuitry 204 and first highpass filter circuitry 206 associated with Stage 1A. FIG. 10A shows the phase response of first lowpass filter circuitry 204 and first highpass filter circuitry 206, in this example, they are 90 degrees out-of-phase. Thus, adding or subtracting them with first combiner circuitry 212 may yield the same magnitude response, which is shown in FIG. 10B. FIG. 10C shows the phase response for first combiner circuitry 212 when configured as an adder and as a subtractor. The subtraction plot may create far more phase shift across the band than the addition plot. Referring again to the phase response in FIG. 10A, first lowpass filter circuitry 204 may start at 0 degrees, then at high frequencies first highpass filter circuitry 206 may dominate the output. The transition may span from 0 degrees to either −360 degrees or −540 degrees, depending on whether first combiner circuitry 212 is configured as an adder or as a subtractor. FIG. 10D shows the group delay when first combiner circuitry 212 is configured as an adder and as a subtractor. There may be more group delay when first combiner circuitry 212 is configured as a subtractor, as expected, because there is more phase change in that branch. Allpass filtering circuitry 208 may compensate the phase of the signal going through Stage 1A.

Referring now to FIG. 11, a diagram 1100 showing the phase responses of first combiner circuitry 212 configured as an adder and allpass filtering circuitry 208 are provided. The phase response of each is similar. Second lowpass filter circuitry 214 and second highpass filter circuitry 220 may be similar to or the same as first lowpass filter circuitry 204 and first highpass filter circuitry 206, so their magnitude and phase relationships may be the same as well.

Figure 12A:
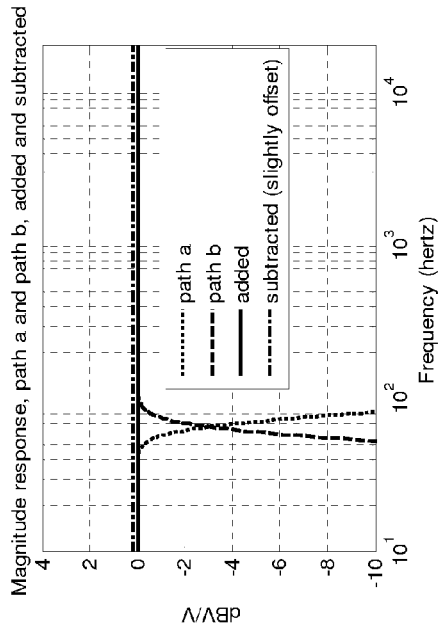
FIGS. 12A-12D depict a number of diagrams showing various responses generated by the excursion limiter of FIG. 2A.
Figure 12B:
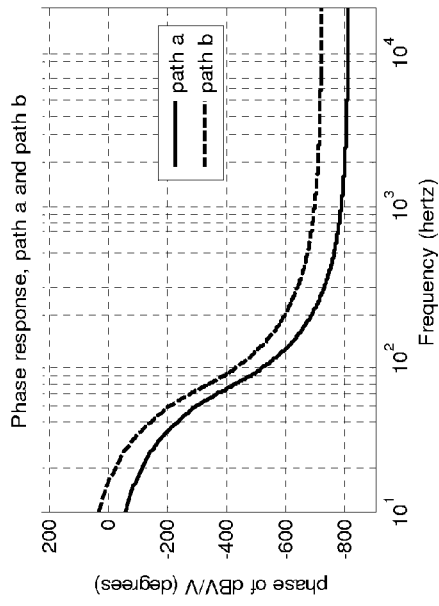
Figure 12C:
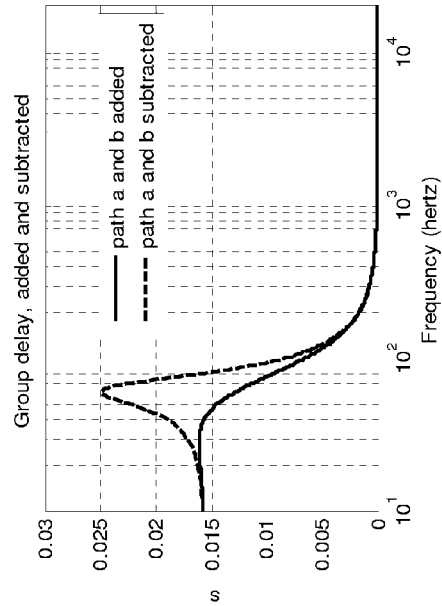
Figure 12D:
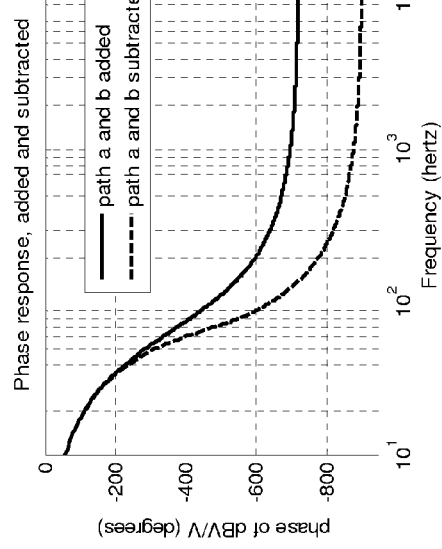

Referring now to FIGS. 12A-12D, a number of diagrams 1200 showing the phase response, magnitude response, and group delay for Path A (i.e., the cascade of Stage 1A and Stage 2A) and Path B (i.e., the cascade of Stage 1B and Stage 2B) are provided. FIG. 12A depicts the overall phase response for Path A and Path B, showing they are +90 degrees, or −90 degrees apart, depending on whether second combiner circuitry 216 is configured as an adder or a subtractor. FIG. 12B depicts the magnitude response for Path A, Path B, and the combination of the two paths added and subtracted. This figure shows Path A is essentially a lowpass path and Path B is essentially a high pass path, and the sum or difference may yield the same flat magnitude response. FIG. 12C shows the phase response for Path A and Path B when added and when subtracted. The overall phase may be different if addition or subtraction is performed at second combiner circuitry 216. In this particular example, configuring second combiner circuitry 216 as an adder appears to provide the best results in terms of minimizing overall group delay.

Therefore, in the linear region, when using $5^{th}$ order filtering circuitry, first combiner circuitry 212 and second combiner circuitry 216 may perform most properly when configured as adders. However, this analysis applies for the linear region, analysis of the non-linear region is provided below.

As discussed above, the analysis shown in FIGS. 10-12 involved operation in a linear range. Any effect produced by clipping circuitry 210 was disregarded and linear time-invariant operation was assumed. However, as the system input signal 202 approaches and/or exceeds the predetermined threshold of clipping circuitry 210, the results may differ as is discussed in further detail below with reference to FIGS. 13-16.

Referring now to FIGS. 13-16, diagrams depicting the phase, magnitude and group delay in the non-linear region are provided. Here, Path A and Path B were combined such that the threshold for clipping circuitry 210 is stepped from approximately 0 to approximately 1. Results for the addition and subtraction of Path A and Path B are provided in FIGS. 13A-13D.

Figure 13B:
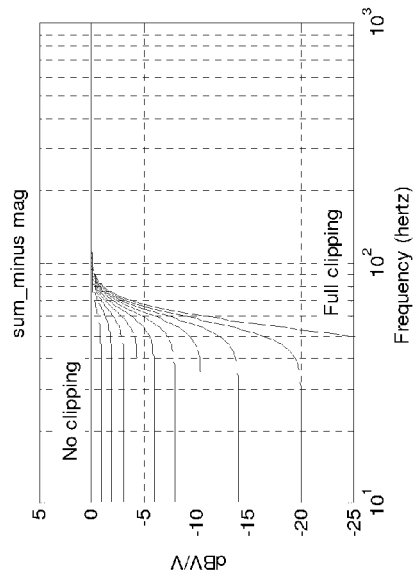
FIGS. 13A-13D depict a number of diagrams showing various responses generated by the excursion limiter of FIG. 2A.
Figure 13D:
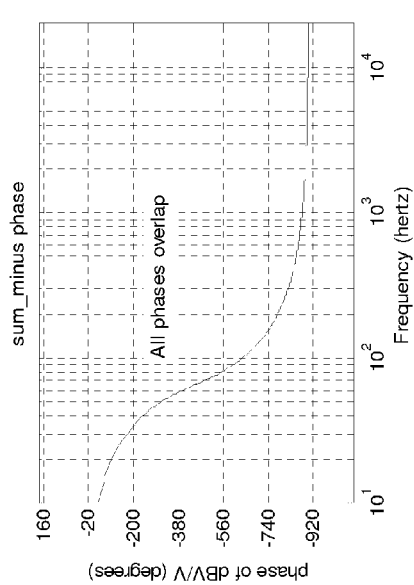
Figure 13A:
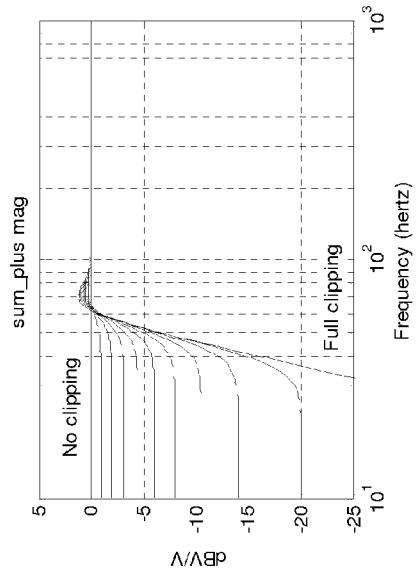
Figure 13C:
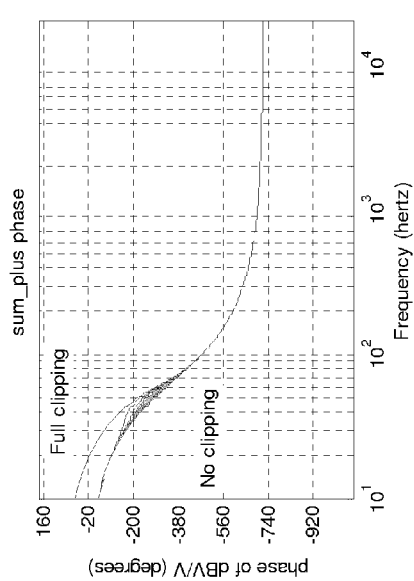

FIGS. 13A-13B show the magnitude and phase diagrams when second combiner circuitry 216 is configured as an adder. For the case of addition there seems to be some imperfect reconstruction, as evidenced by the ripple in the magnitude response (FIG. 13A) and the phase response (FIG. 13B), which may vary depending on the threshold value. In contrast, FIGS. 13C-13D show the magnitude and phase diagrams when second combiner circuitry 216 is configured as a subtractor. For the case of subtraction, the response appears improved, with no ripple, and a consistent phase regardless of the threshold value. Comparing FIG. 13A with FIG. 13C shows that there may be more attenuation in the crossover region of the addition magnitude response than the subtraction magnitude response. This may be seen in the curves that show the output when clipping circuitry 210 is set at approximately 0. When second combiner circuitry 216 is configured as a subtractor, the attenuation may be approximately −24 dB. When first combiner circuitry 212 is configured as a subtractor, the attenuation may be only approximately 7 dB.

As discussed above, allpass circuitry 208 in Stage 1B may be designed to match the phase response of the linear sum of first lowpass filtering circuitry 204 and clipping circuitry 210 in Stage 1A. However, when clipping circuitry 210 is limiting the signal through the upper branch of Stage 1A (i.e., first lowpass filtering circuitry 204, etc.), there may be a mismatch in the phase response between Path A and Path B because clipping circuitry 210 may effectively discount the contribution through first lowpass filtering circuitry 204. If an extremely low threshold is associated with clipping circuitry 210, or if very high input signals are provided, little to no signal may pass through first lowpass filtering circuitry 204.

Figure 14:
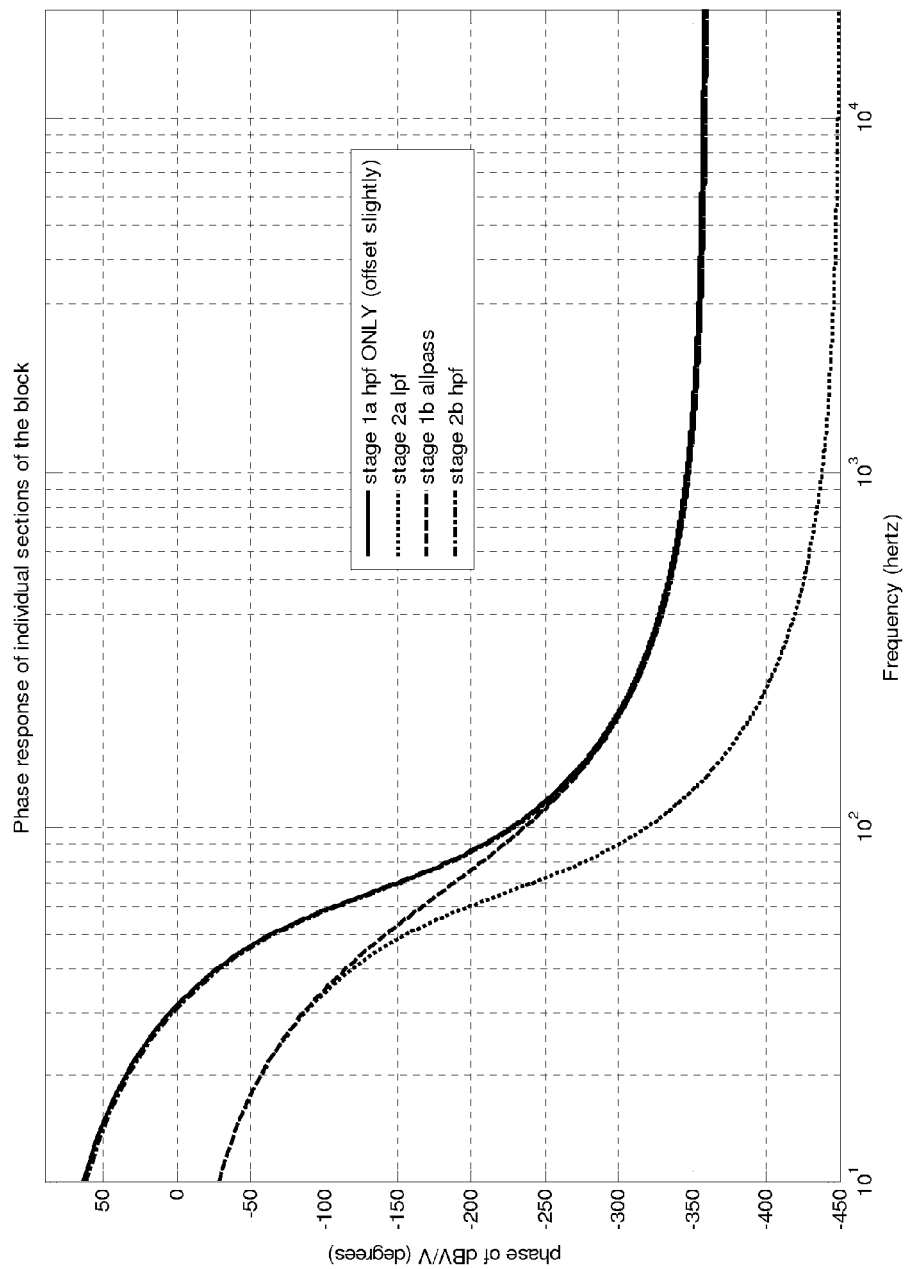
FIG. 14 depicts a diagram showing a response generated by the excursion limiter of FIG. 2A.
Figure 15C:
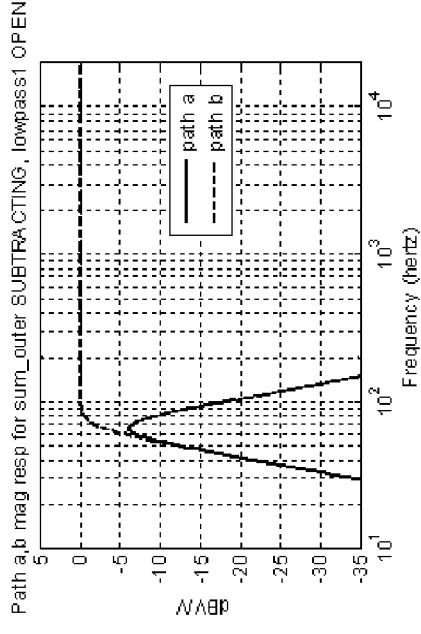
FIGS. 15A-15D depict a number of diagrams showing various responses generated by the excursion limiter of FIG. 2A.
Figure 15D:
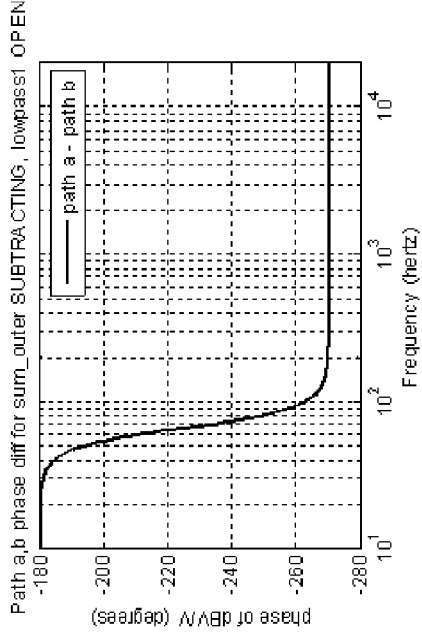
Figure 15A:
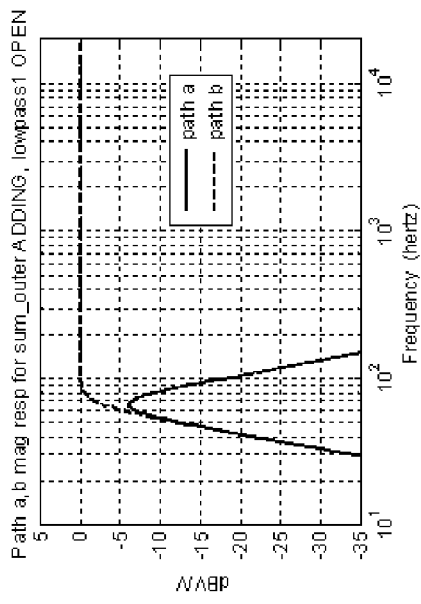
Figure 15B:
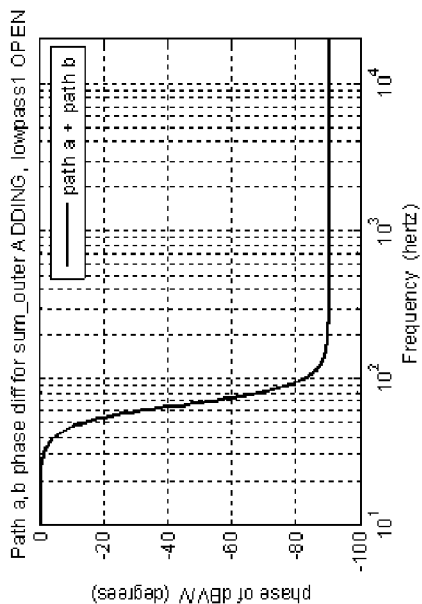

Referring now to FIG. 14, a diagram 1400 showing the phase response of various portions of system 200 when it is in the non-linear operating mode is provided. More specifically, FIG. 14 shows the phase response of first highpass filtering circuitry 206, second lowpass filtering circuitry 214, allpass filtering circuitry 208, and second highpass filtering circuitry 220. Here, system input signal 202 may be a sinusoid having its frequency in the transition region, and a large amplitude, so that the signal transmitted through first highpass filtering circuitry 206 of Stage 1A may be much larger than that transmitted through first lowpass filtering circuitry 204 and clipping circuitry 210.

Referring now to FIGS. 15A-15D, a number of diagrams 1500 showing the magnitude response and the phase difference for second combiner circuitry 216 configured as an adder (FIG. 15A-15B) and as a subtractor (FIGS. 15C-15D) are shown. The magnitude response in both cases for Path A appears like a bandpass, and Path B appears like a highpass. The resultant phase responses between the adding and subtracting cases are slightly different. When second combiner circuitry 216 is configured as an adder, the phase difference may be approximately 0 degrees at the low end, and approximately −90 degrees at the high end. When second combiner circuitry 216 is configured as a subtractor, the phase difference may be approximately −180 degrees at low frequencies, and −270 degrees at high frequencies. This may affect the amount of attenuation at low frequencies. If second combiner circuitry 216 is configured as a subtractor, Path A and Path B may be out-of-phase. There may be high attenuation of the signal, which may provide a good rejection of low frequencies through this path, allowing a controlled amount through first lowpass filtering circuitry 204 and clipping circuitry 210.

Referring now to FIGS. 16A-16B, a number of diagrams 1600 showing the magnitude response for both Path A and Path B when second combiner circuitry 216 is configured as an adder (FIG. 16A) and as a subtractor (FIG. 16B) are provided. When second combiner circuitry 216 is configured as an adder, Path A and Path B may be in phase, so they do not cancel each other. FIG. 16A shows the linear sum of Path A and Path B with second combiner circuitry 216 configured as an adder. FIG. 16B shows second combiner circuitry 216 configured as a subtractor. Note the cancellation of the linear sum in FIG. 16B, while in FIG. 16A the signal has a bit of a bump at the transition region, and does not disappear nearly as quickly.

As a result, although selecting first combiner circuitry 212 as an adder and second combiner circuitry 216 as a subtractor for $5^{th}$ order filters may not result in the least overall group delay in the linear range, this configuration provides better performance as an excursion limiter, as there may be less leakage of low frequency components throughout system 200 having a consistent phase response at different amounts of saturation.

The embodiments described herein may be configured to minimize the excursion over an entire band of audio inputs, not necessarily a bandpass region. Some embodiments may be used at the low frequency end of a speaker's range.

The embodiments described herein may be used to limit the excursion associated with a variety of different types of audio speakers. Some applications may include, but are not limited to, woofers, subwoofers, tuned enclosures (e.g., bass reflex and waveguide enclosures), midrange speakers, etc.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Nevertheless, it will be understood that various modifications may be made. Accordingly, other implementations are within the scope of the following claims.

What is claimed is:

1. A system for limiting excursion of an audio speaker comprising:
    a first lowpass filter circuitry configured to receive a system input signal, the first lowpass filter circuitry configured to generate a first filtered output signal and to provide the first filtered output signal to a clipping circuitry;
    a first combiner circuitry configured to receive a signal from the clipping circuitry;
    a first highpass filter circuitry configured to receive the system input signal and to generate a second filtered output signal, the first highpass filter circuitry configured to provide the second filtered output signal to the first combiner circuitry;
    a second lowpass filter circuitry configured to receive a combined output signal from the first combiner circuitry and to provide a third filtered output signal to a second combiner circuitry;
    an allpass filter circuitry configured to receive the system input signal and to generate a fourth filtered output signal; and
    a second highpass filter circuitry configured to receive the fourth filtered output signal from the allpass filter circuitry and to provide a fifth filtered output signal to the second combiner circuitry, the second combiner circuitry configured to generate an excursion limiting output signal.

2. The system of claim 1 wherein at least one of the first and second lowpass filter circuitries and at least one of the first and second highpass filter circuitries include a $3^{rd}$ order Butterworth filter.

3. The system of claim 1 wherein at least one of the first and second lowpass filter circuitries and at least one of the first and second highpass filter circuitries include a $5^{th}$ order Butterworth filter.

4. The system of claim 2 wherein the first combiner circuitry is configured as a subtractor.

5. The system of claim 4 wherein the second combiner circuitry is configured as an adder.

6. The system of claim 3 wherein the first combiner circuitry is configured as an adder.

7. The system of claim 6 wherein the second combiner circuitry is configured as a subtractor.

8. The system of claim 2 wherein the allpass filter circuitry includes a first order allpass filter.

9. The system of claim 3 wherein the allpass filter circuitry includes a second order allpass filter.

10. The system of claim 1 further comprising polarity circuitry configured between the allpass filter circuitry and the second highpass filter circuitry.

11. A method for limiting excursion of an audio speaker comprising:
    receiving a system input signal at a first lowpass filter circuitry;
    generating a first filtered output signal at the first lowpass filter circuitry;
    receiving the first filtered output signal at a clipping circuitry;
    clipping the first filtered output signal via the clipping circuitry;
    receiving a signal from the clipping circuitry at a first combiner circuitry;
    receiving the system input signal at a first highpass filter circuitry;
    generating a second filtered output signal at the first highpass filter circuitry;
    receiving the second filtered output signal at the first combiner circuitry;
    combining, at the first combiner circuitry, the first filtered output signal and the second filtered output signal to generate a combined output signal;
    receiving the combined output signal at a second lowpass filter circuitry;
    generating a third filtered output signal at the second lowpass filter circuitry and providing the third filtered output signal to a second combiner circuitry;
    receiving the system input signal at an allpass filter circuitry;
    generating a fourth filtered output signal at the allpass filter circuitry;
    receiving the fourth filtered output signal at a second highpass filter circuitry;
    generating a fifth filtered output signal at the second highpass filter circuitry and providing the fifth filtered output signal to the second combiner circuitry; and
    combining, at the second combiner circuitry, the third filtered output signal and the fifth filtered output signal to generate an excursion limiting output signal.

12. The method of claim 11 wherein at least one of the first and second lowpass filter circuitries and at least one of the first and second highpass filters circuitries include a $3^{rd}$ order Butterworth filter.

13. The method of claim 11 wherein at least one of the first and second lowpass filter circuitries and at least one of the first and second highpass filter circuitries include a $5^{th}$ order Butterworth filter.

14. The method of claim 12 further comprising subtracting, at the first combiner circuitry, the first filtered output signal and the second filtered output signal.

15. The method of claim 14 further comprising adding, at the second combiner circuitry, the third filtered output signal and the fifth filtered output signal.

16. The method of claim 13 further comprising adding, at the first combiner circuitry, the first filtered output signal and the second filtered output signal.

17. The method of claim 16 further comprising subtracting, at the second combiner circuitry, the third filtered output signal and the fifth filtered output signal.

18. The method of claim 12 wherein the allpass filter circuitry includes a first order allpass filter.

19. The method of claim 13 wherein the allpass filter circuitry includes a second order allpass filter.

20. The method of claim 11 further comprising reversing a polarity of the fourth filtered output signal using polarity circuitry provided between the allpass filter circuitry and the second highpass filter circuitry.

* * * * *